(12) United States Patent
Xie et al.

(10) Patent No.: US 11,784,125 B2
(45) Date of Patent: Oct. 10, 2023

(54) WRAP AROUND CROSS-COUPLE CONTACT STRUCTURE WITH ENHANCED GATE CONTACT SIZE

(71) Applicant: International Business Machines Corporation, Armonk, NY (US)

(72) Inventors: Ruilong Xie, Niskayuna, NY (US); Kangguo Cheng, Schenectady, NY (US); Chanro Park, Clifton Park, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 17/375,670

(22) Filed: Jul. 14, 2021

(65) Prior Publication Data

US 2023/0018698 A1 Jan. 19, 2023

(51) Int. Cl.
*H01L 23/528* (2006.01)
*H01L 27/092* (2006.01)
*H01L 21/768* (2006.01)
*H01L 23/532* (2006.01)

(52) U.S. Cl.
CPC .... *H01L 23/5283* (2013.01); *H01L 21/76804* (2013.01); *H01L 21/76877* (2013.01); *H01L 23/5329* (2013.01); *H01L 27/0924* (2013.01)

(58) Field of Classification Search
CPC ......... H01L 21/76897; H01L 21/76804; H01L 21/76831; H01L 23/485; H01L 23/5283; H01L 23/5329; H01L 29/785
See application file for complete search history.

(56) References Cited

U.S. PATENT DOCUMENTS

| 8,947,912 | B2 | 2/2015 | Calhoun et al. |
| 9,406,616 | B2 | 8/2016 | Woo et al. |
| 9,589,966 | B2 | 3/2017 | Hsu et al. |
| 10,326,002 | B1* | 6/2019 | Zang ............... H01L 21/823468 |
| 2018/0114792 | A1 | 4/2018 | Basker et al. |
| 2018/0315762 | A1* | 11/2018 | Kim .................... H01L 27/0886 |
| 2019/0043758 | A1* | 2/2019 | Zang ............... H01L 21/823475 |
| 2019/0198491 | A1 | 6/2019 | Do et al. |
| 2019/0385946 | A1* | 12/2019 | Xie ..................... H01L 27/0886 |
| 2021/0111028 | A1 | 4/2021 | Xie et al. |
| 2021/0296162 | A1* | 9/2021 | Yu ..................... H01L 23/53295 |
| 2022/0246623 | A1* | 8/2022 | Hwang ........... H01L 21/823828 |
| 2022/0359297 | A1* | 11/2022 | Chen ................ H01L 21/76895 |
| 2022/0367353 | A1* | 11/2022 | You .................. H01L 21/76802 |

* cited by examiner

*Primary Examiner* — Jaehwan Oh
*Assistant Examiner* — John M Parker
(74) *Attorney, Agent, or Firm* — Scully, Scott, Murphy & Presser, P.C.; Samuel Waldbaum (57) ABSTRACT

A cross-couple contact structure is provided that is located on, and physically contacts, a topmost surface of a functional gate structure that is located laterally adjacent to a gate cut region. The cross-couple contact structure extends into the laterally adjacent gate cut region and physically contacts a sidewall of the functional gate structure, an upper portion of a first sidewall of a dielectric plug that is present in the gate cut region, and an upper surface of a dielectric liner that is located on a lower portion of the first sidewall of the dielectric plug.

20 Claims, 10 Drawing Sheets

WRAP AROUND CROSS-COUPLE CONTACT STRUCTURE WITH ENHANCED GATE CONTACT SIZE

BACKGROUND

The present application relates to semiconductor technology, and more particularly to a semiconductor structure including a cross-couple contact structure (i.e., gate-to-source/drain cross-couple, XC, structure) that not only contacts a topmost surface of a functional gate structure that is located laterally adjacent to a gate cut region, but extends into the gate cut region and contacts a sidewall of the functional gate structure.

In static random access memory (SRAM), there is a trade-off between the gate cut region, CT, and the gate contact size for the gate-to-source/drain cross-couple, XC. If the SRAM is aggressively scaled with very small NFET-to-PFET space (n-2-p space), the gate cut region is cut towards to the dummy semiconductor fin at the PFET side, such that the dummy semiconductor fin is tucked under the gate cut, and the gate contact size for the gate-to-source/drain cross-couple, XC, becomes very small. There is thus a need to provide a semiconductor structure which overcomes the problems mentioned above.

SUMMARY

A cross-couple contact structure (i.e., gate-to-source/drain cross-couple, XC, structure) is provided that is located on, and physically contacts, a topmost surface of a functional gate structure that is located laterally adjacent to a gate cut region. The cross-couple contact structure extends into the laterally adjacent gate cut region and physically contacts a sidewall of the functional gate structure, an upper portion of a first sidewall of a dielectric plug that is present in the gate cut region, and an upper surface of a dielectric liner that is located on a lower portion of the first sidewall of the dielectric plug. This wrap around cross-couple contact structure has an improved gate contact size and thus overcomes the problems associated with aggressively scaled semiconductor devices.

In one aspect of the present application, a semiconductor structure is provided. In one embodiment of the present application, the semiconductor structure includes a dielectric plug located in a gate cut region and having a first sidewall, a bottom wall, and a second sidewall opposite the first sidewall. A dielectric liner is located in the gate cut region and on an entirety of the second sidewall of the dielectric plug, the bottom wall of the dielectric plug, and a lower portion of the first sidewall of the dielectric plug. A cross-couple contact structure is located on, and physically contacts, a topmost surface of a functional gate structure that is located laterally adjacent to the gate cut region, wherein the cross-couple contact structure extends into the gate cut region and physically contacts a sidewall of the functional gate structure, an upper portion of the first sidewall of the dielectric plug, and an upper surface of the dielectric liner that is located on the lower portion of the first sidewall of the dielectric plug.

In another aspect of the present application, a method of forming a semiconductor structure is provided. In one embodiment, the method includes forming a gate cut region between two laterally adjacent semiconductor channel-containing structures, wherein one of the semiconductor channel-containing structures is a present in an NFET device region and the other of the semiconductor channel-containing structures is located in a PFET device region. A bilayer dielectric material structure is then formed in the gate cut region, wherein the bilayer dielectric material structure includes a dielectric plug having a first sidewall, a bottom wall, and a second sidewall opposite the first sidewall, and a dielectric layer lining the first sidewall, the bottom wall, and the second sidewall of the dielectric plug, and wherein the first sidewall of the dielectric plug faces the semiconductor channel-containing structure present in the PFET device region. Next, a functional gate structure is formed on the semiconductor channel-containing structure in at least the PFET device region, and thereafter a cross-couple contact region is formed that physically exposes a topmost surface of the functional gate structure present in the PFET device region, wherein during the forming of the cross-couple contact region an upper portion of the dielectric layer that is located the first sidewall of the dielectric plug is removed. A cross-couple contact structure is then formed in the cross-couple contact region, wherein the cross-couple contact structure physically contacts a topmost surface of the functional gate structure present in the PFET device region, and extends into the gate cut region so that the cross-couple contact structure physically contacts a sidewall of the functional gate structure, an upper portion of the first sidewall of the dielectric plug, and an upper surface of the dielectric layer that is located on a lower portion of the first sidewall of the dielectric plug.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
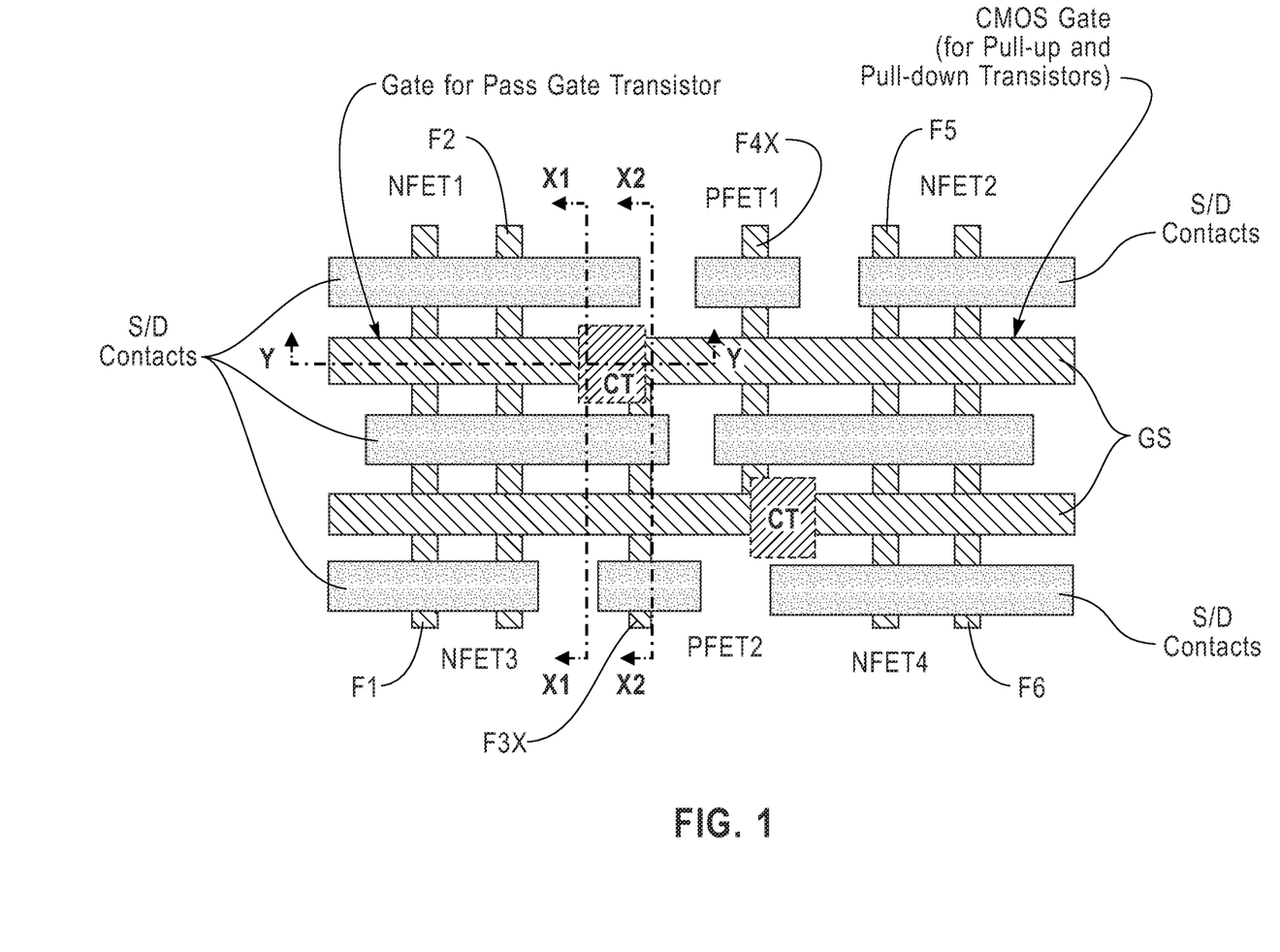
FIG. 1 is a top down view showing a SRAM design layout that can be employed in accordance with an embodiment of the present application.

Referring first to FIG. 1, there is illustrated a SRAM design layout (i.e., 6T SRAM) that can be employed in accordance with an embodiment of the present application. The SRAM design layout includes four, 4, NFET devices, NFET1, NFET2, NFET3, and NFET4, and two PFET devices, PFET1 and PFET2. Each NFET device includes two semiconductor fins, each PFET device includes one semiconductor fin. NFET1 and NFET4 are pass gate (PG) transistors, and the gate of each of the PG transistors is separated with the CMOS gate (for PD and PU transistors) next to it by a gate cut (CT) region which is very close to the ends of the PFET FIN tucked under the functional gate structure. FIG. 1 also shows the location of the S/D contacts and the gate-to-source/drain cross-couple, XC, contacts, (hereinafter "cross-couple contact structures") for the SRAM. Cross-couple, XC, contacts are located very close to the CT regions, and when CT moves very close to the PFET device region, the overlap between the cross-couple contact, XC, structure and the functional gate structure becomes very small, and the cross-couple contact could become weak (high resistance) or even has open failure.

The SRAM design layout shown in FIG. 1 illustrates one aggressively scaled field effect transistor (FET)-containing design layout that can be employed in the present application. By "aggressively scaled" it is meant CT region is very close to the PFET device region such that overlap between the cross-couple contact structure to the functional gate structure is very small. Other aggressively scaled FET-containing design layouts including gate cut regions which would benefit from an increased gate contact size can also be employed in the present application. For example, the design layout could be an 8T SRAM. It is further noted that the number of semiconductor fins in each device region (i.e., NFET and PFET) is not limited to the number of semiconductor fins that is illustrated in FIG. 1 and that the present application can be employed using any number of semiconductor fins present in each of the device regions. In FIG. 1, F1, F2, F5 and F6 are non-cut semiconductor fins, while FX3 and FX4 are cut semiconductor fins.

The SRAM design layout shown in FIG. 1 illustrates various cross sectional views that will be exemplified throughout the present application. Notably, the SRAM device layout of FIG. 1 includes a cross sectional view X1-X1 which is along a region including a gate cut region (or trench) that is located between NFET1 and the PFET device including PFET2, a cross sectional view X2-X2 which is along a length of cut semiconductor fin F3X, and a cross sectional view Y-Y which is along one of the functional gate structures, GS. As used throughout the present application, the term "cut semiconductor fin" denotes a semiconductor fin in which a portion thereof is removed, i.e., cut, during the formation of the gate cut region. The removed, cut, portion of the cut semiconductor fin is located laterally adjacent one of the cut regions. In the remaining drawings, FIGS. 2A, 3A, 4A, 5A, 6A, 7A, 8A, 9A and 10A are cross sectional views along X1-X1 during various processing steps of the present application, FIGS. 2B, 3B, 4B, 5B, 6B, 7B, 8B, 9B and 10B are cross sectional views along X2-X2 during various processing steps of the present application, and FIGS. 2C, 3C, 4C, 5C, 6C, 7C, 8C, 9C and 10C are cross sectional views along Y-Y during various processing steps of the present application Although the present application describes and illustrates semiconductor fins as the semiconductor channel-containing structure, the present application can be employed with other types of semiconductor channel-containing structures such as, for example, semiconductor nanowires, or semiconductor nanosheets are used instead of semiconductor fins.

Figure 2A:
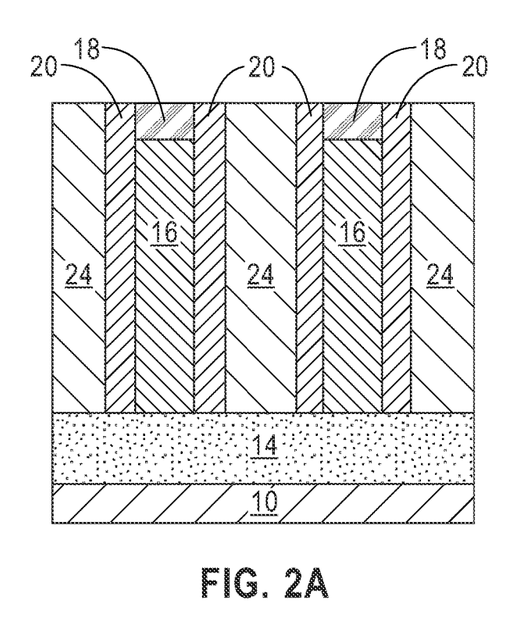
FIG. 2A is cross sectional view of an exemplary semiconductor structure that can be employed in accordance with an embodiment of the present application and through X1-X1 shown in FIG. 1, the exemplary structure including a plurality of semiconductor fins extending upward from a surface of a substrate, a sacrificial gate structure located on a surface of each semiconductor fin, a source/drain region located on each side of the sacrificial gate structure, a shallow trench isolation structure located at a bottom of each semiconductor fin, a dielectric spacer located laterally adjacent to, and on sidewalls of, the sacrificial gate structure, and an interlayer dielectric (ILD) material layer located laterally adjacent to the dielectric spacer.
Figure 2B:
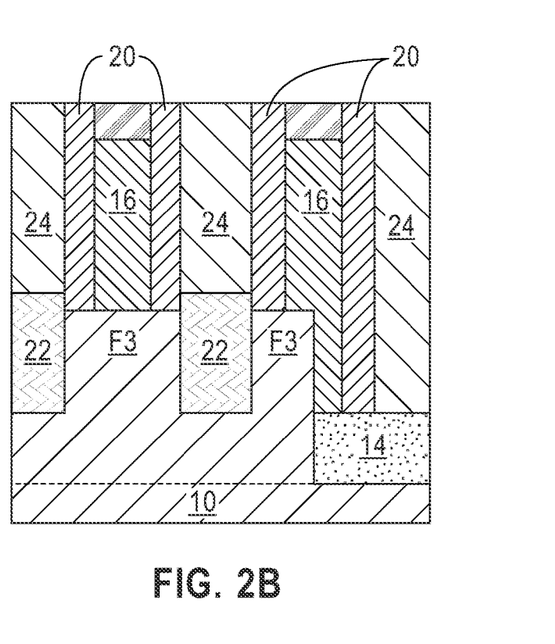
FIG. 2B is cross sectional view of an exemplary semiconductor structure that can be employed in accordance with an embodiment of the present application and through X2-X2 shown in FIG. 1, the exemplary structure including a plurality of semiconductor fins extending upward from a surface of a substrate, a sacrificial gate structure located on a surface of each semiconductor fin, a source/drain region located on each side of the sacrificial gate structure, a shallow trench isolation structure located at a bottom of each semiconductor fin, a dielectric spacer located laterally adjacent to, and on sidewalls of, the sacrificial gate structure, and an interlayer dielectric (ILD) material layer located laterally adjacent to the dielectric spacer.
Figure 2C:
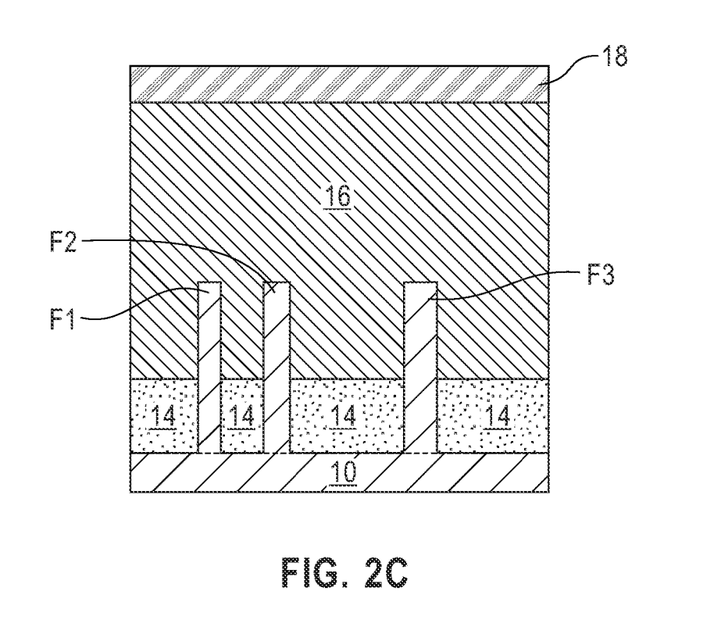
FIG. 2C is cross sectional view of an exemplary semiconductor structure that can be employed in accordance with an embodiment of the present application and through Y-Y shown in FIG. 1, the exemplary structure including a plurality of semiconductor fins extending upward from a surface of a substrate, sacrificial gate structures located on a surface of each semiconductor fin, a source/drain region located on each side of each sacrificial gate structure, a shallow trench isolation structure located at a bottom of each semiconductor fin, a dielectric spacer located laterally adjacent to, and on sidewalls of, each sacrificial gate structure, and an interlayer dielectric (ILD) material layer located laterally adjacent to the dielectric spacer.

Referring now to FIGS. 2A, 2B and 2C, there are illustrated an exemplary semiconductor structure that can be employed in accordance with an embodiment of the present application. It is noted that the exemplary structure shown in FIGS. 2A, 2B and 2C (and FIGS. 3A-10C) illustrate the SRAM design layer of FIG. 1 including an NFET device region including NFET1 and only a portion of the laterally adjacent PFET device region including PFET2. Notably, the exemplary structure of FIGS. 2A, 2B and 2C includes a plurality of semiconductor fins, F1, F2 and F3; F3 is a non-cut semiconductor fin prior to providing cut semiconductor fin F3X, extending upward from a surface of a substrate 10, sacrificial gate structures 16/18 located on a surface of each semiconductor fin, F1, F2 and F3, a source/drain region 22 located on each side of each sacrificial gate structure 16/18, a shallow trench isolation structure 14 located at a bottom of each semiconductor fin, F1, F2 and F3, a dielectric spacer 20 located laterally adjacent to, and on sidewalls of, each sacrificial gate structures 16/18, and an interlayer dielectric (ILD) material layer 24 located laterally adjacent to the dielectric spacer 20.

The exemplary semiconductor structure shown in FIGS. 2A, 2B and 2C can be formed utilizing various processing techniques that are well known to those skilled in the art. For example, semiconductor fins, F1, F2 and F3 can be formed by patterning a substate including at least an upper semiconductor material portion, the sacrificial gate structure 16/18 can be formed by deposition of a sacrificial gate material stack and then patterning the sacrificial gate material stack, the shallow trench isolation structure 14 can be formed by deposition of a dielectric material, followed by an etch back process, the source/drain regions 22 can be formed by an epitaxial growth process in which the dopants can be added during the epitaxial growth process or after the epitaxial growth process, the dielectric spacer 20 can be formed by deposition of a dielectric spacer material, followed by a spacer etch, and the ILD material layer can be formed by depositing an ILD material, and optionally performing a planarization process such as, for example, chemical mechanical polishing (CMP). Other processing techniques besides those mentioned hereinabove can be used to form any of the elements of the exemplary semiconductor structure shown in FIGS. 2A, 2B and 2C. For example, the source/drain regions 22 can be formed by ion implantation into a semiconductor material portion of a semiconductor substrate.

In one embodiment of the present application, substate 10 can be entirely composed of one or more semiconductor materials. Examples of semiconductor materials that can be used to provide the substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In such an embodiment, substrate 10 can be referred to a bulk semiconductor substrate.

In another embodiment of the present application, substrate 10 can be composed of a multilayered stack of from bottom to top, a semiconductor material layer, and an insulator material layer. In such an embodiment, the semiconductor material layer can be composed of at least one of the semiconductor materials mentioned above, and the insulator material layer can be composed of a dielectric material such as, for example, silicon oxide, and/or boron nitride.

In yet another embodiment, substrate 10 is composed entirely of a dielectric material such as, for example, silicon oxide, silicon nitride, or silicon oxynitride.

The semiconductor fins, F1, F2 and F3 (or other semiconductor channel containing structures) are composed of one of the semiconductor materials mentioned above for substrate 10. The semiconductor material that provides the semiconductor fins, F1, F2 and F3 can be compositionally the same as, or compositionally different from, at least an uppermost semiconductor material portion of substrate 10. In some embodiments, each semiconductor fin, F1, F2 and F3 are composed of a compositionally same semiconductor material. In other embodiments, semiconductor fins F1 and F2 are composed of first semiconductor material that is capable of providing high channel mobility for NFET devices, while semiconductor fin, F3, is a composed of a second semiconductor material that is compositionally different from the first semiconductor material and is capable of providing high channel mobility for PFET devices. In some of the drawings, a dotted line is shown between the substrate 10 and each semiconductor fin F1, F2 and F3 to show a possible location of a material interface between the substrate 10 and the semiconductor fins F1, F2 and F3.

Each semiconductor fin F1, F2 and F3 is oriented parallel to each other. Each semiconductor fin F1, F2 and F3 typically has a same height and width. In one example, each semiconductor fin F1, F2 and F3 has a height as measured from a topmost surface of the substrate 10 to the topmost surface of the semiconductor fin, of from 30 nm to 200 nm, and a width, as measured from one sidewall surface of a semiconductor fin to an opposing sidewall surface of the same semiconductor fin, of from 5 nm to 20 nm. Other heights and widths besides those mentioned herein are contemplated and can thus be employed in the present application.

The shallow trench isolation structure 14, which is located on the substrate 10, and is positioned laterally adjacent to a lower portion of each semiconductor fin F1, F2 and F3, can be composed of a dielectric material such as, for example, silicon oxide, silicon nitride, silicon oxynitride, or any suitable combination of those dielectric materials. The shallow trench isolation structure 14 has a height that is less than a height of each semiconductor fin F1, F2 and F3 so that an upper portion of each semiconductor fin F1, F2 and F3 is physically exposed and can be used as active channel of a FET device. In some embodiments, especially when at least an upper portion of substrate 10 is composed of a dielectric material, shallow trench isolation structure 14 can be omitted. The height of the active FIN channel (from a topmost surface of the shallow trench isolation structure 14 to the topmost surface of the semiconductor fin) ranges from 15 nm to 100 nm.

The sacrificial gate structures 16/18 include at least a sacrificial gate material layer 16. An optional sacrificial hard mask cap 18 can be present on a topmost surface of the sacrificial gate material layer 16. In some embodiments, a thin sacrificial gate dielectric material layer (not shown) can be present beneath the sacrificial gate material layer 16. Each sacrificial gate structure 16/18 is oriented perpendicular to each semiconductor fin F1, F2 and F3. Each sacrificial gate structure 16/18 passes over a portion of each semiconductor fin F1, F2 and F3.

The sacrificial gate material layer 16 can be composed of a sacrificial gate material including, but not limited to, polysilicon, amorphous silicon, amorphous silicon germanium, tungsten, titanium, tantalum, aluminum, nickel, ruthenium, palladium, platinum, or alloys of such metals. When a semiconductor material is used as the sacrificial gate material, the semiconductor material that provides the sacrificial gate material layer 16 is compositionally different from the semiconductor material that provides each semiconductor fin F1, F2 and F3.

The optional sacrificial hard mask cap 18 can be composed of a hard mask dielectric material such as, for example, silicon oxide, silicon nitride or silicon oxynitride. The hard mask dielectric material that provides the optional sacrificial hard mask cap 18 can be compositionally the same as, or compositionally different from the dielectric material that provides the shallow trench isolation structure 14.

The dielectric spacer 20 is composed of a dielectric spacer material such as, for example, silicon oxide, silicon nitride, or silicon oxynitride. In some embodiments, and as is illustrated in FIGS. 2A and 2B, the dielectric spacer 20 is pillar shaped and has a topmost surface that is coplanar with a topmost surface of each of the optional hard mask cap 18 and the ILD material layer 24 to be subsequently formed. When the optional sacrificial hard mask cap 18 is omitted (not shown), the dielectric spacer 20 has a topmost surface that is coplanar with a topmost surface of each of the sacrificial gate material layer 16 and the ILD material layer 24 to be subsequently formed.

The source/drain regions 22 are composed of a semiconductor material and a dopant. As used herein, a "source/drain" region can be a source region or a drain region depending on subsequent wiring and application of voltages during operation of the field effect transistor (FET). The semiconductor material that provides the source/drain regions 22 can include one of the semiconductor materials mentioned above for the substrate 10. The semiconductor material that provides the source/drains regions 22 can be compositionally the same as, or compositionally different from, the semiconductor material that provides each semiconductor fin. The dopant that is present in the source/drain regions 22 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions 22 can have a dopant concentration of from $4 \times 10^{20}$ atoms/cm$^3$ to $3 \times 10^{21}$ atoms/cm$^3$.

The ILD material layer 24 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 24 can include a multilayered structure that includes at least two different dielectric materials stacked one atop the other such as, for example, silicon nitride and silicon dioxide.

Figure 3A:
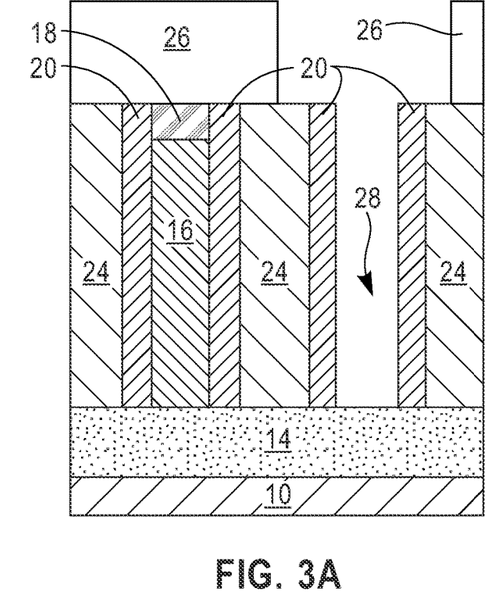
FIG. 3A is cross sectional view of the exemplary semiconductor structure of FIG. 2A after forming a gate cut region.
Figure 3B:
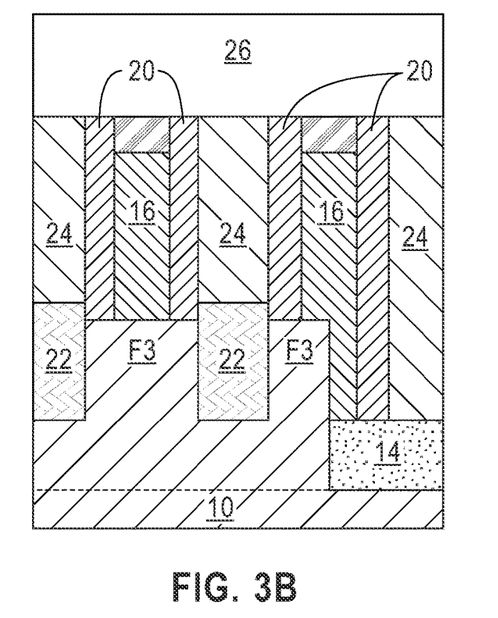
FIG. 3B is cross sectional view of the exemplary semiconductor structure of FIG. 2B after forming a gate cut region.
Figure 3C:
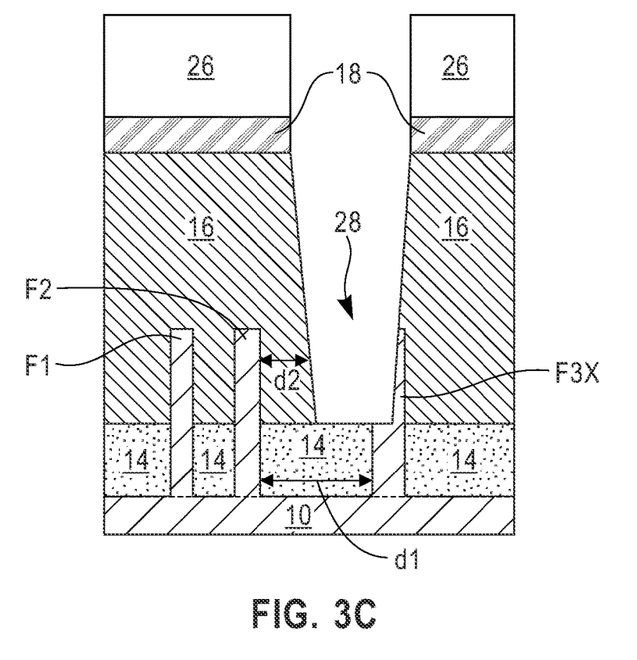
FIG. 3C is cross sectional view of the exemplary semiconductor structure of FIG. 2C after forming a gate cut region.

Referring now to FIGS. 3A, 3B and 3C, there are illustrated the exemplary semiconductor structure of FIGS. 2A, 2B and 2C, respectively, after forming a gate cut region 28; CT in FIG. 1. The gate cut region 28 is formed in the present application by first forming a patterned mask 26 having an opening over the exemplary structure shown in FIGS. 2A, 2B and 2C. The opening (not labeled in FIGS. 3A and 3C), physically exposes one of the sacrificial gate structures 16, 18 that is located laterally adjacent to F3 and in a region positioned between F2 and F3. The patterned mask 26 can be composed of an organic planarization layer (OPL) and it can be formed by first depositing a blanket layer of OPL, and then patterning the OPL by lithography and etching.

The physically exposed sacrificial gate structure 16/18 is then removed utilizing the patterned mask 26 as an etch mask and utilizing one or more etching processes. In some embodiments and as is shown in the drawings, the removal of the physically exposed sacrificial gate structure 16/18 also removes a portion of the semiconductor fin F3. In other embodiments, the semiconductor fin F3 is not removed during this step of the present application. The remaining semiconductor fin F3 can be referred to herein as cut semiconductor fin FX3. As is shown in FIG. 3C, the cut semiconductor fin F3X includes a portion that remains tucked under a remaining portion of the sacrificial gate structure 16/18 that is located laterally adjacent to the gate cut region 28; when F3 is non-cut, a portion of F3 remains beneath the sacrificial gate structure 16/18. This tucked portion of F3X, or F3 if not cut, serves as a dummy channel in the final structure. In some embodiments, the removal of the physically exposed sacrificial gate structure 16/18 and the underlying portion of semiconductor fin F3 can be performed utilizing a single etching process. It is noted that this illustration is for an extremely case in which CT moves very close to the PFET dummy FIN end such that portion of the F3 is cut to form F3X. In less scaled SRAMs, CT may not cut the PFET dummy FIN end, and thus the present application still works for the non-cut semiconductor fin.

Referring back to FIG. 3C, d1 represents a space, i.e., distance, between the NFET and PFET (n-2-p space), and d2 represents a distance that the sacrificial gate structure 16/18 (and a subsequently formed functional gate structure) extends over semiconductor fin F2. In the present application, d1 is from 25 nm to 80 nm, and d2 is from 7 nm to 20 nm.

Figures 4A, 4B, 4C:
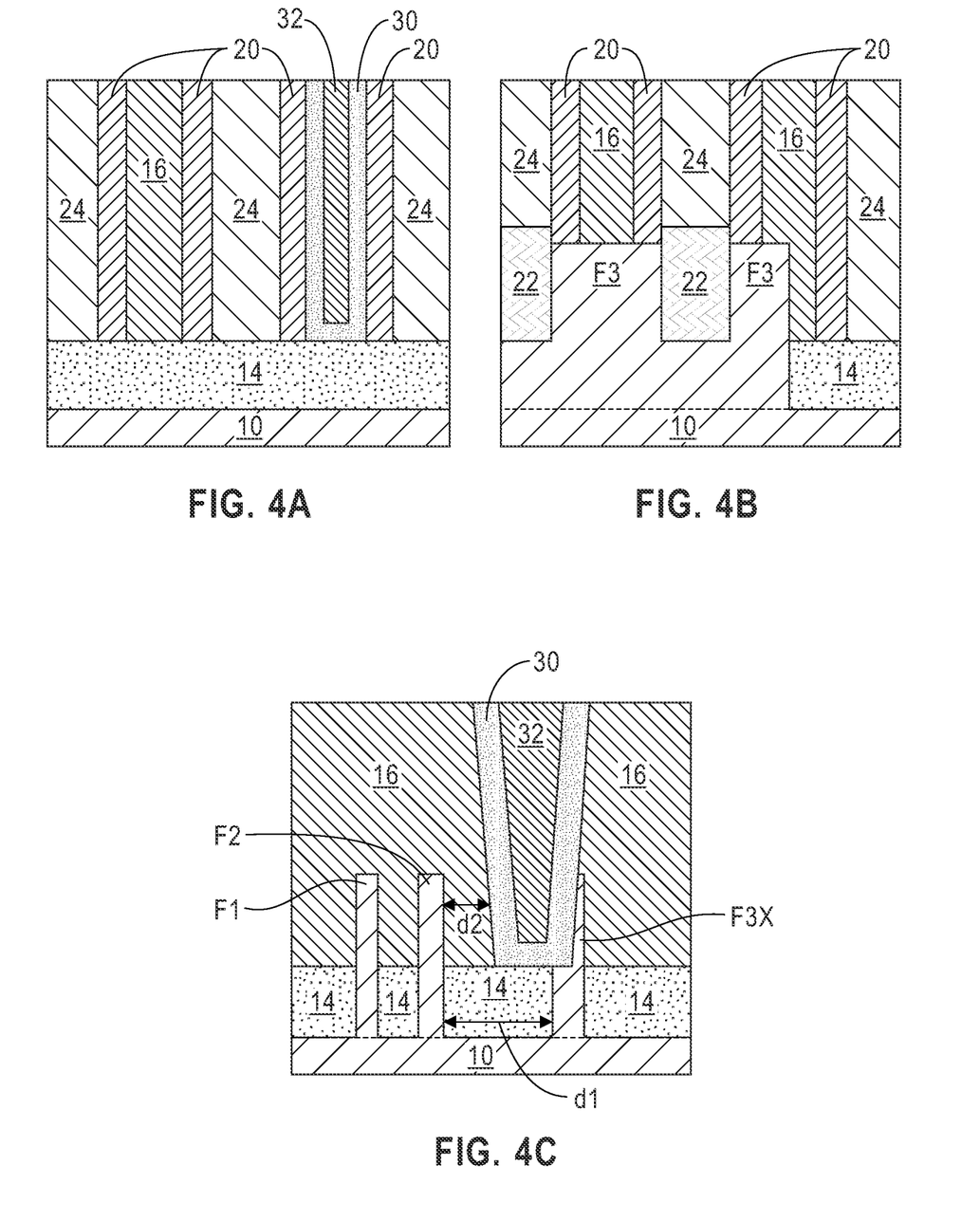
FIG. 4A is cross sectional view of the exemplary semiconductor structure of FIG. 3A after forming a bilayer dielectric material structure in the gate cut region.
FIG. 4B is cross sectional view of the exemplary semiconductor structure of FIG. 3B after forming a bilayer dielectric material structure in the gate cut region.
FIG. 4C is cross sectional view of the exemplary semiconductor structure of FIG. 3C after forming a bilayer dielectric material structure in the gate cut region.

Referring now to FIGS. 4A, 4B and 4C, there are illustrated the exemplary semiconductor structure of FIGS. 3A, 3B and 3C, respectively, after forming a bilayer dielectric material structure 30/32 in the gate cut region 28. The formation of the bilayer dielectric material structure 30/32 includes removing the patterned mask 26 from the structure shown in FIGS. 3A, 3B and 3C. The patterned mask 26 can be removed utilizing a stripping process which causes substantially no damage to the layers of the exemplary structure that lie beneath the patterned mask 26. In one embodiment, the patterned mask 26 can be stripped utilizing an oxygen plasma, a nitrogen/hydrogen plasma or other carbon stripping processes.

After removing the patterned mask 26, the bilayer dielectric material structure 30/32 is now formed by first forming a conformal layer of first dielectric material (not shown) on the physically exposed surface of the exemplary semiconductor structure and within the gate cut region 28. As used herein, the term "conformal layer" denotes that a material layer has a vertical thickness along horizontal surfaces that is substantially the same (i.e., within ±5%) as the lateral thickness along vertical surfaces. In one example, the first dielectric material that provides the conformal layer of first dielectric material is a silicon nitride based dielectric material such as, for example, silicon nitride, silicon boron carbon nitride, or a dielectric including atoms of Si, O, C and N. Other dielectric materials beside a silicon nitride based dielectric can be used as the first dielectric material.

The conformal layer of first dielectric material can be formed by a conformal deposition process, including but not limited to, atomic layer deposition (ALD), chemical vapor deposition (CVD), plasma enhanced chemical vapor deposition (PECVD) or physical vapor deposition (PVD). The conformal layer of first dielectric material can have a thickness from 1 nm to 15 nm, although lesser and greater thicknesses can also be employed. The conformal layer of first dielectric material does not entirely fill in the volume of the gate cut region 28.

After forming the conformal layer of a first dielectric material, a second dielectric material (not shown) is formed on the conformal layer of first dielectric material; the second dielectric material fills in a remaining volume of the gate cut region 28 and it is also formed outside of the gate cut region 28. The second dielectric material can be composed of a second dielectric material which is compositionally different from the first dielectric material that provides the conformal layer of first dielectric material; by selecting compositionally different dielectric materials, the first and second dielectric materials have different etch rates in a particular etchant such that one of the dielectrics can be removed selectively to the other. In one example, and when the first dielectric material is a silicon nitride based dielectric material, the second dielectric material is a silicon carbon based dielectric material such as, for example, silicon carbide or a dielectric including atoms of Si, C and O. The second dielectric material can be formed by ALD, CVD, PECVD, PVD, evaporation or spin-on coating.

After forming the conformal layer of first dielectric material and the second dielectric material, a planarization process such as, for example, chemical mechanical polishing (CMP), can be employed to remove the conformal layer of first dielectric material and the second dielectric material that are present outside of the gate cut region 28. This planarization process stops on a topmost surface of the sacrificial hard mask cap 18. Thus, the planarization process also removes the sacrificial hard mask cap 18, as well as an upper portion of each of the ILD material layer 24 and the dielectric spacer 20.

The conformal layer of first dielectric material and the second dielectric material that are present in the gate cut region 28 remain after the planarization. The remaining conformal layer of first dielectric material can be referred to as a dielectric layer 30, and the remaining second dielectric material can be referred to as a dielectric plug 32. Collectively, the dielectric layer 30 and the dielectric plug 32 provide the bilayer dielectric material structure 30/32.

The dielectric layer 30, which is composed of the first dielectric material, is present along the sidewalls and bottom wall of the dielectric plug 32, which is composed of the second dielectric material. As is shown in FIGS. 4A and 4C the dielectric layer 30 is U-shaped. The dielectric plug 32 has a topmost surface that is coplanar with a topmost surface of the dielectric layer 30. The topmost surface of both the dielectric plug 32 and dielectric layer 30 are coplanar with a topmost surface of each of the ILD material layer 24, the dielectric spacer 20 and the sacrificial gate material layer 16.

In some embodiments, and as is shown in FIG. 4C, the dielectric plug 32 in the gate cut region 28 has tapered sidewalls that increase upward from a bottommost surface of the dielectric plug 32 to a topmost surface of the dielectric plug 32.

Figure 5A:
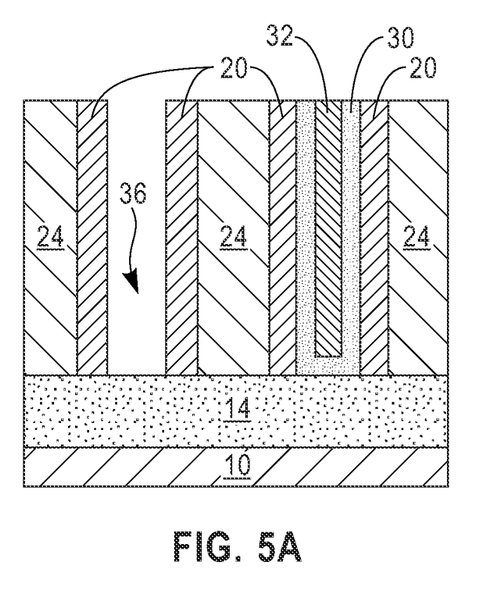
FIG. 5A is cross sectional view of the exemplary semiconductor structure of FIG. 4A after removing each sacrificial gate structure to provide a gate cavity.
Figure 5B:
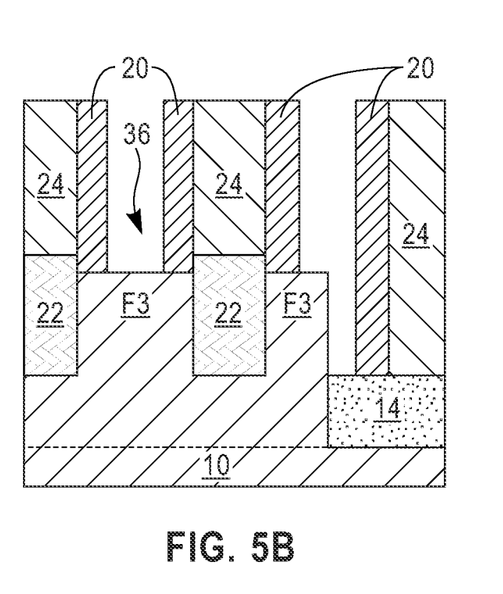
FIG. 5B is cross sectional view of the exemplary semiconductor structure of FIG. 4B after removing each sacrificial gate structure to provide a gate cavity.
Figure 5C:
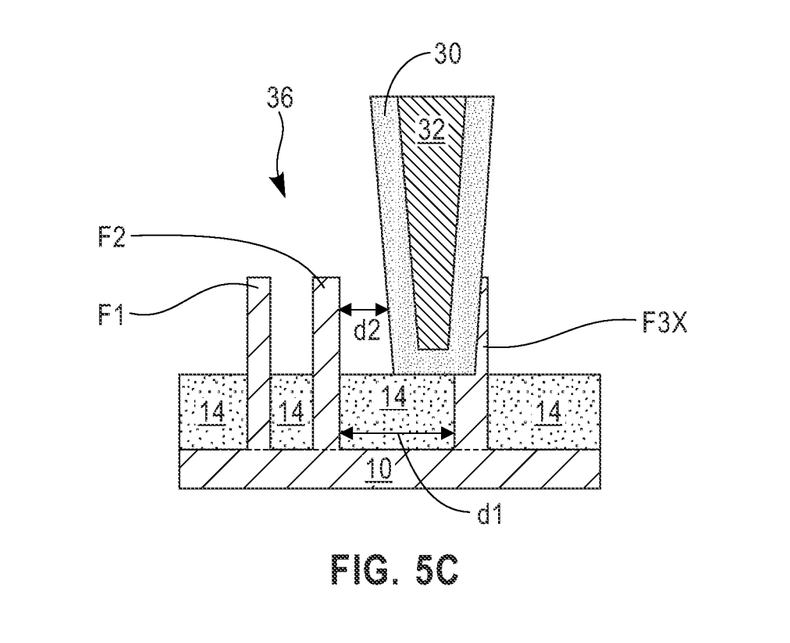
FIG. 5C is cross sectional view of the exemplary semiconductor structure of FIG. 4C after removing each sacrificial gate structure to provide a gate cavity.

Referring now to FIGS. 5A, 5B and 5C, there are illustrated the exemplary semiconductor structure of FIGS. 4A, 4B and 4C, respectively, after removing each sacrificial gate structure to provide a gate cavity 36. Since the optional hard mask cap 18 was removed in a previously performed planarization process used to provide the bilayer dielectric material structure 30/32, the sacrificial gate material layer 16 and, if present, the sacrificial gate dielectric material layer are removed during this step of the present invention. The sacrificial gate material layer 16 and, if present, the sacrificial gate dielectric material layer can be removed utilizing an etching process(es) that is(are) selective in removing the sacrificial gate material layer 16 and if present, the sacrificial gate dielectric material layer relative to the other material layers that are present in the structure.

Figure 6A:
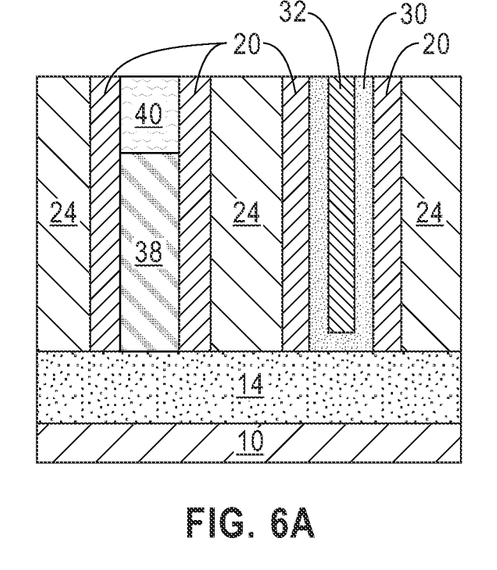
FIG. 6A is cross sectional view of the exemplary semiconductor structure of FIG. 5A after forming a functional gate structure in each gate cavity.
Figure 6B:
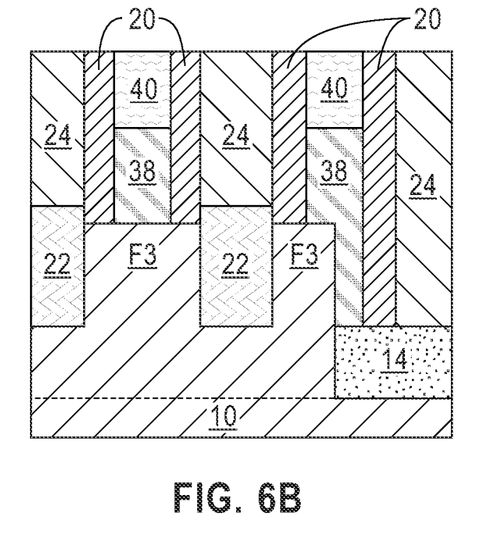
FIG. 6B is cross sectional view of the exemplary semiconductor structure of FIG. 5B after forming a functional gate structure in each gate cavity.
Figure 6C:
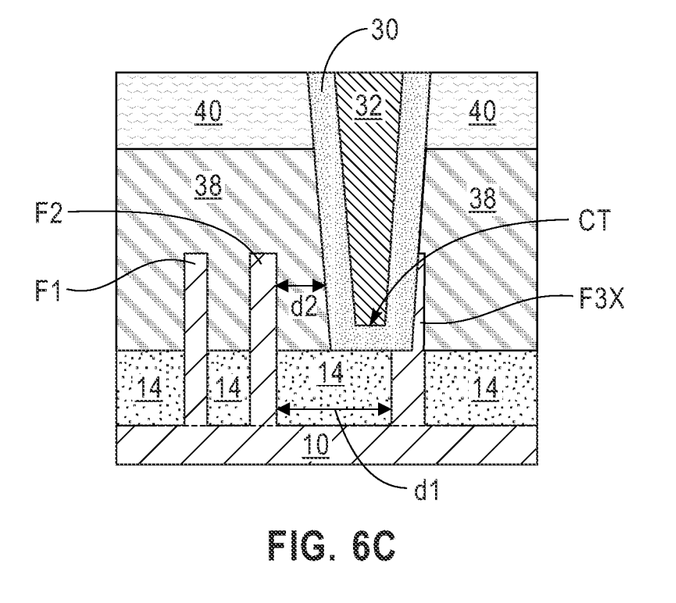
FIG. 6C is cross sectional view of the exemplary semiconductor structure of FIG. 5C after forming a functional gate structure in each gate cavity.

Referring now to FIGS. 6A, 6B and 6C, there are illustrated the exemplary semiconductor structure of FIGS. 5A, 5B and 5C, respectively, after forming a functional gate structure 38 in each gate cavity 36. The functional gate structure 38 includes at least a gate dielectric material layer and a gate electrode; both of which are not individually shown in the drawings of the present application. In some embodiments, the gate dielectric material layer is U-shaped and is present along sidewalls and a bottom wall of the gate electrode. In other embodiments, the gate dielectric material layer is located entirely beneath the gate electrode. In some embodiments, the functional gate structure 38 includes a work function metal (WFM) layer located between the gate dielectric material layer and the gate electrode. In some embodiments, a gate cap 40 is located above a recessed functional gate structure 38.

The formation of the functional gate structure 38 includes forming a continuous layer of gate dielectric material and a gate electrode material inside and outside each gate cavity 36. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiON), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity 36.

The gate electrode material can include an electrically conductive metal-containing material including, but not limited to, tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process as mentioned above. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity 36.

The remaining continuous layer of the gate dielectric material that is present inside each gate cavity 36 can be referred to as a gate dielectric material layer, the remaining optional layer of WFM that is present inside the gate cavity 36 can be referred to a WFM layer, and remaining gate electrode material that is present inside the gate cavity provides a gate electrode.

In some embodiments, the functional gate structure 38 is recessed and a gate cap 40 composed of the first dielectric material mentioned above for forming dielectric layer 30 is formed atop the functional gate structure 38 by deposition and planarization.

In some embodiments, block mask technology can be implemented to form functional gate structures 38 that are tailored for the specific device region, i.e., NFET device region or PFET device region.

Figure 7A:
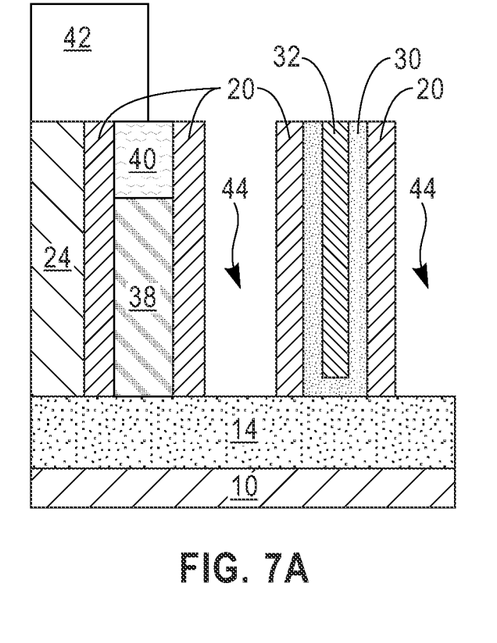
FIG. 7A is cross sectional view of the exemplary semiconductor structure of FIG. 6A after forming a source/drain contact trench on opposing sides of each functional gate structure.
Figure 7B:
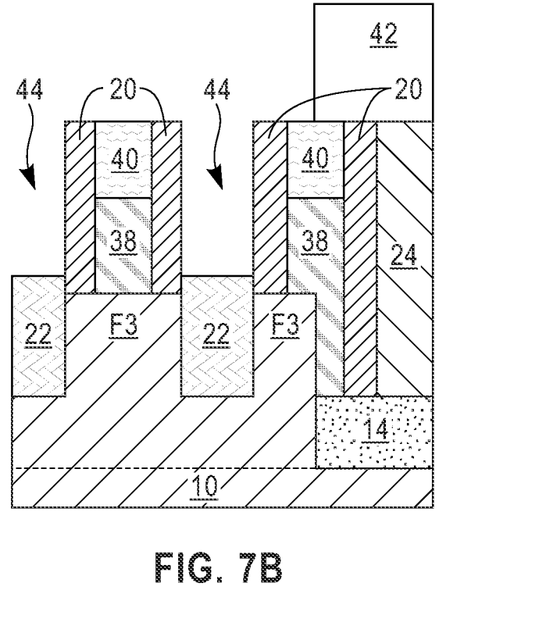
FIG. 7B is cross sectional view of the exemplary semiconductor structure of FIG. 6B after forming a source/drain contact trench on opposing sides of each functional gate structure.
Figure 7C:
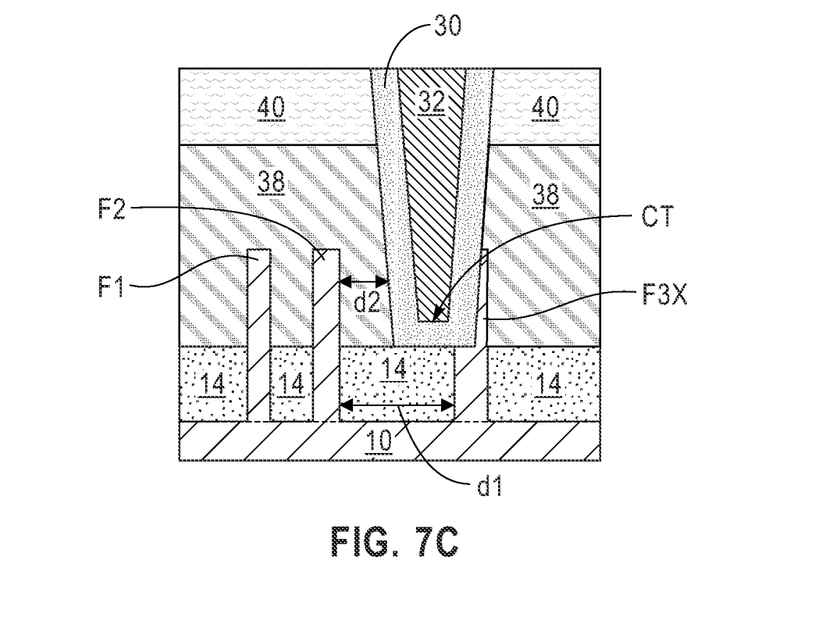
FIG. 7C is cross sectional view of the exemplary semiconductor structure of FIG. 6C after forming a source/drain contact trench on opposing sides of each functional gate structure.

Referring now to FIGS. 7A, 7B and 7C, there are illustrated the exemplary semiconductor structure of FIGS. 6A, 6B and 6C, respectively, after forming a source/drain contact trench 44 on opposing sides of each functional gate structure 38. The forming of the source/drain contact trenches 44 includes first forming a second patterned mask 42 having a source/drain contact opening formed therein; the previously described patterned mask 26 can be referred to as first patterned mask 26. The second patterned mask 42 can include an OPL as defined above and the second patterned mask 42 can be formed by deposition, lithography and etching. The source/drain contact opening physically exposed portions of the exemplary structure in which at least source/drain contacts will be subsequently formed. An etch is then performed to selectively remove the physically exposed ILD material layer 24 that is not protected by the second patterned mask 42. This etch used to remove the physically exposed ILD material layer 24 does not however remove the functional gate cap 40, the dielectric spacer 20, the dielectric layer 30, and the dielectric plug 32.

Figure 8A:
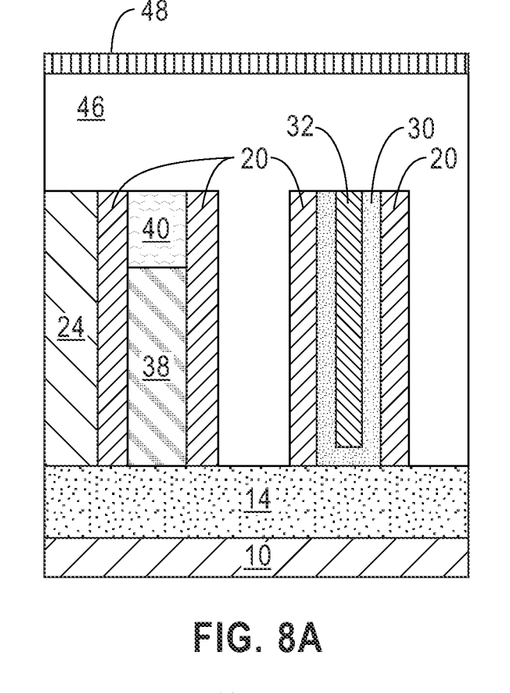
FIG. 8A is cross sectional view of the exemplary semiconductor structure of FIG. 7A after forming a patterned mask having a cross-couple contact opening.
Figure 8B:
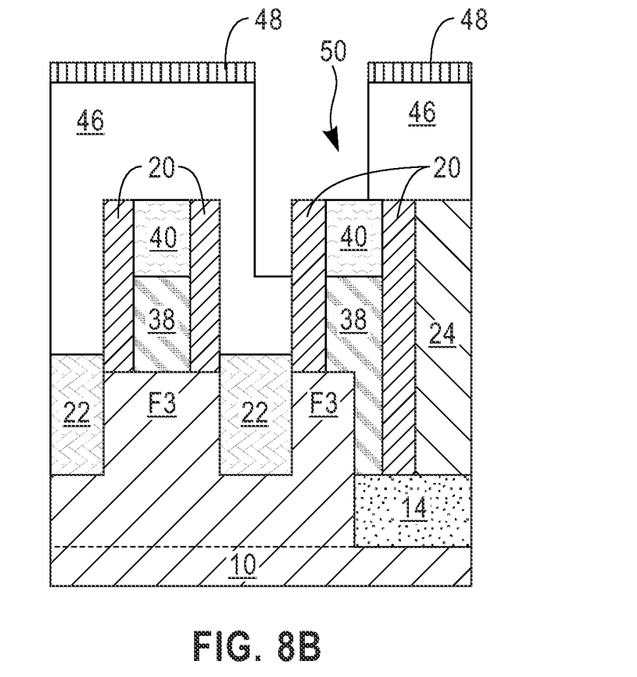
FIG. 8B is cross sectional view of the exemplary semiconductor structure of FIG. 7B after forming a patterned mask having a cross-couple contact opening.
Figure 8C:
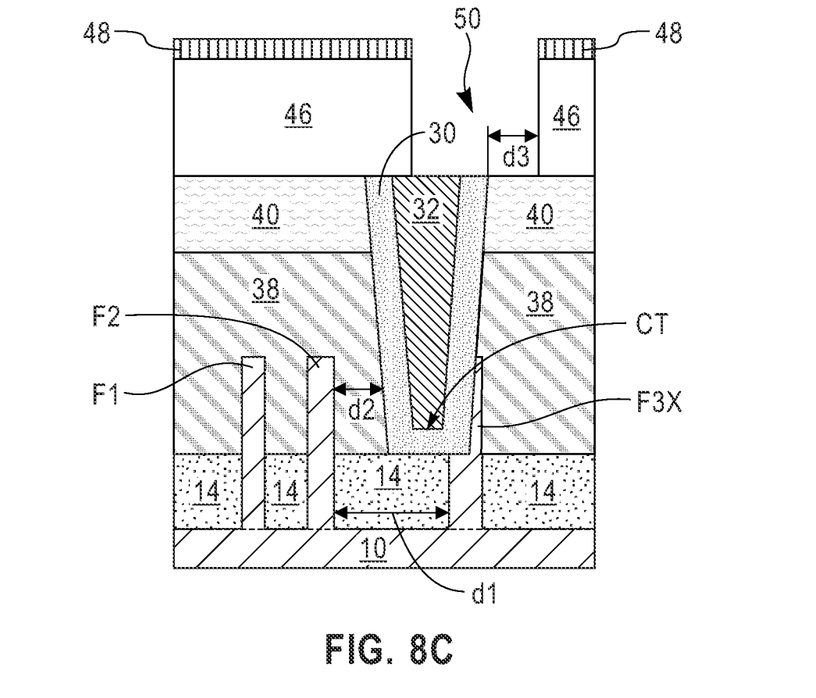
FIG. 8C is cross sectional view of the exemplary semiconductor structure of FIG. 7C after forming a patterned mask having a cross-couple contact opening.

Referring now to FIGS. 8A, 8B and 8C, there are illustrated the exemplary semiconductor structure of FIGS. 7A, 7B and 7C, respectively, after forming a patterned mask 46 having a cross-couple, XC, contact opening 50; this patterned mask can be referred to a third patterned mask 46; gate contact openings (not shown) can be formed as well. The third patterned mask 46 is formed by first filling the source/drain contact trenches 44 with OPL that is the same as used in providing the second patterned mask 42.

Lithography and etching are then used to form the cross-couple contact opening 50. The cross-couple contact opening 50 is located between the semiconductor fin F2 and the cut semiconductor fin F3X, and a portion of the cross-couple contact opening 50 extends over the gate cut region 28 such that a portion of the bilayer dielectric material structure 30/32 is physically exposed. Thus, the cross-couple contact opening 50 physically exposes a portion of the bilayer dielectric material structure 30/32 and the dielectric cap 40 that is located above the functional gate structure 38 that is formed on the tucked portion of F3X. In FIG. 8C, d3 represents the gate contact size. In the present application, d3 is from 5 nm to 30 nm.

Figure 9A:
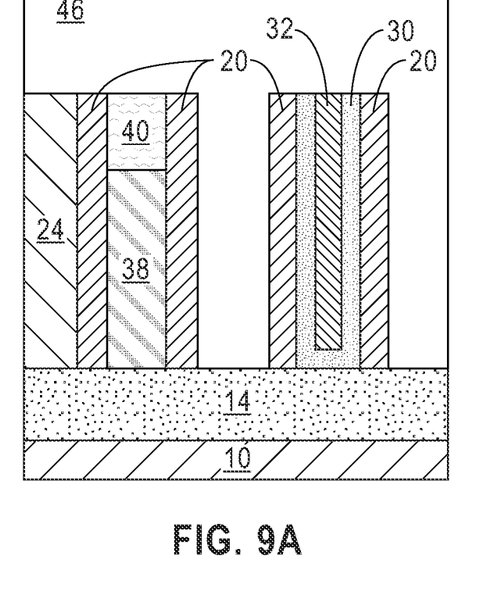
FIG. 9A is cross sectional view of the exemplary semiconductor structure of FIG. 8A after performing a selective etch to provide a cross-couple contact region.
Figure 9B:
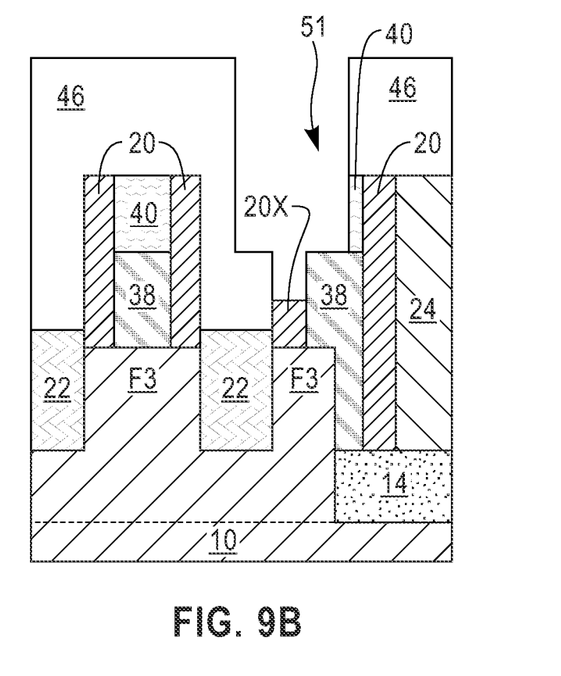
FIG. 9B is cross sectional view of the exemplary semiconductor structure of FIG. 8B after performing a selective etch to provide a cross-couple contact region.
Figure 9C:
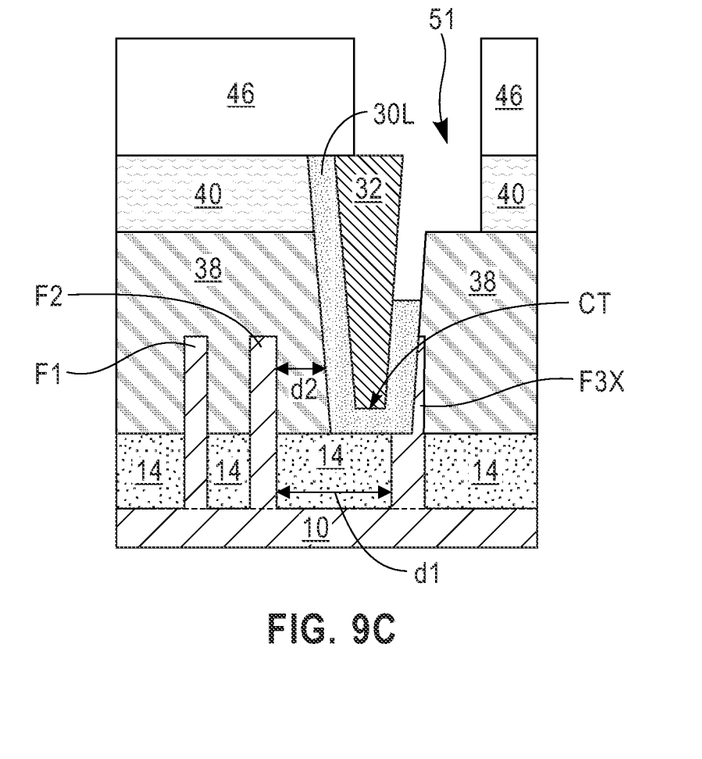
FIG. 9C is cross sectional view of the exemplary semiconductor structure of FIG. 8C after performing a selective etch to provide a cross-couple contact region.

Referring now to FIGS. 9A, 9B and 9C, there are illustrated the exemplary semiconductor structure of FIGS. 8A, 8B and 8C, respectively, after performing a selective etch to provide a cross-couple contact region 51. This selective etch partially removes the physically exposed portion of the gate cap 40 that is located above the functional gate structure 38 which is on the tucked portion of the cut semiconductor fin F3X. This selective etch also removes a portion of the physically exposed dielectric layer 30 to provide dielectric liner 30L. The dielectric liner 30L leaves an upper sidewall surface of the dielectric plug 32 that faces cut semiconductor fin F3X physically exposed. The dielectric liner 30L is located on a lower portion of the sidewall surface of the dielectric plug 32 that faces cut semiconductor fin F3X, a bottom wall of the dielectric plug 32, and the opposing sidewall of the dielectric plug 32 that faces semiconductor fin F2 that is present in NFET device region. Collectively, the dielectric liner 30L and the dielectric plug 32 provide a bilayer dielectric material gate cut structure in the gate cut region 28. As shown in FIG. 9B, a portion of the dielectric spacer 20 along the X2-X2 direction is removed to provide a reduced height dielectric spacer 20X.

The dielectric liner 30L has a first vertically extending portion having a first height that faces the semiconductor fin F2, and a second vertically extending portion that faces the cut semiconductor fin F3X that has a second height that is less than the first height. See, FIG. 9C.

Figure 10A:
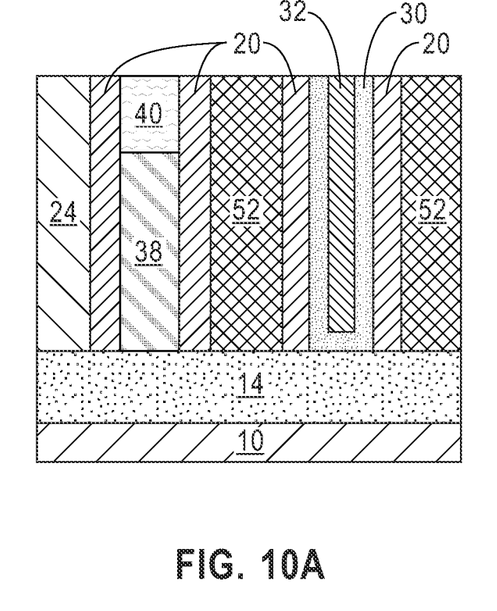
FIG. 10A is cross sectional view of the exemplary semiconductor structure of FIG. 9A after removing the patterned mask, and forming source/drain contact structures and cross-couple contact structures.
Figure 10B:
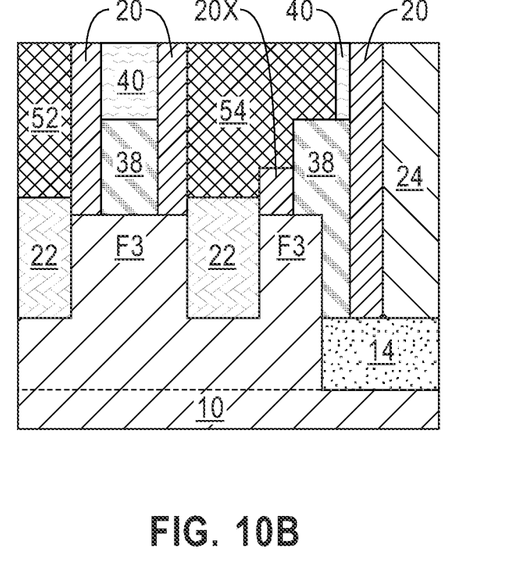
FIG. 10B is cross sectional view of the exemplary semiconductor structure of FIG. 9B after removing the patterned mask, and forming source/drain contact structures and cross-couple contact structures.
Figure 10C:
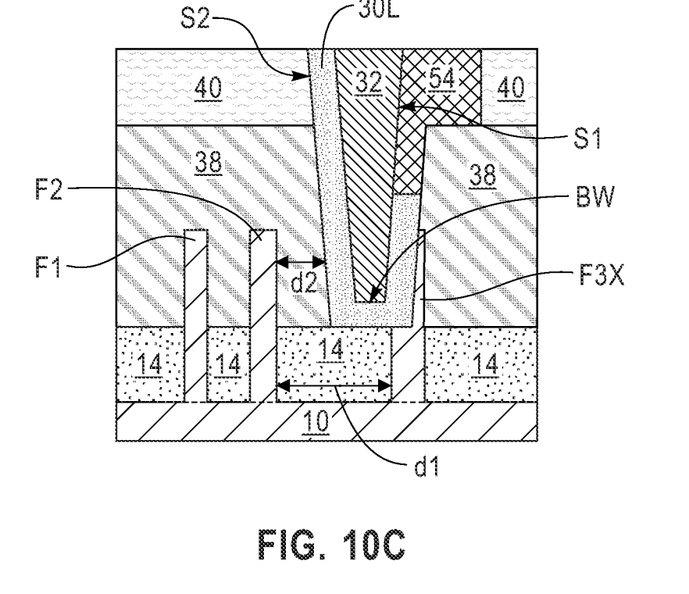
FIG. 10C is cross sectional view of the exemplary semiconductor structure of FIG. 9C after removing the patterned mask, and forming source/drain contact structures and cross-couple contact structures.

Referring now to FIGS. 10A, 10B and 10C, there are illustrated the exemplary semiconductor structure of FIGS. 9A, 9B and 9C, respectively, after removing the third patterned mask 46, and forming source/drain contact structures 52 and cross-couple contact structures 54. The third patterned mask 46 can be removed utilizing one or more etching processes, such as $N_2/H_2$ ash. Source/drain contact openings 44 as well as the cross-couple contact region 51 are now processed to include source/drain contact structures 52 and cross-couple contact structures 54, respectively.

In some embodiments (not shown), a metal semiconductor alloy region can be formed in each of the source/drain contact openings 44 and on an upper surface of the source/drain regions 22. The metal semiconductor alloy region can be composed of a silicide or germicide. In one or more embodiments of the present application, the metal semiconductor alloy region can be formed by first depositing a metal layer (not shown) in each of the source/drain contact openings 44 and on an upper surface of the source/drain regions 22. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions 22 to provide the metal semiconductor alloy regions. The unreacted portion of the metal layer, and, if present, the diffusion barrier, then removed, for example, by an etch process (or a plurality of etching processes). In one embodiment, the etching process can be a wet etch that removes the metal in the metal layer selective to the metal semiconductor alloy in the metal semiconductor alloy regions. A source/drain contact material is then deposited in the source/drain contact openings 44 to form the source/drain contacts 52.

The source/drain contact structures 52 can include one or more source/drain contact liners (not shown) formed along sidewalls of the dielectric spacer 20 and above an upper surface of the source/drain regions 22. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

A contact conductor material is subsequently deposited into each of the source/drain contact openings 44 to completely fill a remaining volume of the source/drain contact openings 44. The contact conductor material can include a metal such as, for example, W, Cu, Al, Co, Ru, Mo, Os, Jr, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the source/drain contact openings 44. The remaining contact conductor material and if present, the contact liner and the metal semiconductor alloy region provide source/drain contact structure 52.

Cross-couple contact region 51 can be processed in a manner similar to that used in forming the source/drain contact structures 52 with the exception that no metal semiconductor alloy region is typically formed in the cross-couple contact region 51. As a result of such processing, a cross-couple contact structure 54 is formed in the cross-couple contact region 51. Cross-couple contact structure 54 includes a remaining portion of a contact conductor material and if present, a remaining portion of the contact liner. The cross-couple contact structure 54 can include a contact conductor material that is compositionally the same as, or compositionally different from, the contact conductor material that provides the source/drain contact structures 52. Also, the cross-couple contact structure 54 can include a contact liner that is compositionally the same as, or compositionally different from, the contact liner that provides the source/drain contact structures 52.

The exemplary semiconductor structure shown in FIG. 10C includes dielectric plug 32 located in gate cut region 28 and having a first sidewall, S1, a bottom wall, BW, and a second sidewall, S2, opposite the first sidewall, S1. In the present application, S1 faces the dummy PFET semiconductor fin FX3 (or F3 if it is not being cut), while S2 faces semiconductor fin F2 which is a NFET active semiconductor fin. Dielectric liner 30L is located in the gate cut region 28 and on an entirety of the second sidewall, S2, of dielectric plug 32, the bottom wall, BW, of dielectric plug 32, and a lower portion of the first sidewall, S1, of dielectric plug 32. Cross-couple contact structure 54 is located on, and physically contacts, a topmost surface of functional gate structure 38 that is located laterally adjacent to the gate cut region. Cross-couple contact structure 54 also extends into the gate cut region and physically contacts a sidewall of functional gate structure 38, an upper portion of the first sidewall, S1, of dielectric plug 32, and an upper surface of dielectric liner 30L that is located on the lower portion of the first sidewall, S1, of dielectric plug 32. The cross-couple contact structure 54 shown in FIG. 10C is a wrap-around gate-to-source/drain cross-couple contact having improved gate contact size, while d1 is scaled and d2 size is hard to reduce. Along the X2-X2 direction, the cross-couple contact structure 54 contacts a surface of one of the source/drain regions 22. See, FIG. 10B.

As is shown in FIG. 10C, the first vertical extending portion of dielectric liner 30L is located entirely on the second sidewall, S2, of dielectric plug 32, and the second vertical extending portion of dielectric liner 30L is located on the lower portion of the first sidewall, S1, of dielectric plug 32, wherein the first vertical extending portion has a height that is greater than the second vertical extending portion. The first and second vertical portions of dielectric liner 30L are connected by a horizontal portion that lines the entire bottom wall, BW, of dielectric plug 32. The first vertical extending portion of dielectric liner 30L has a topmost surface that is coplanar with a topmost surface of each of dielectric plug 32, cross-couple contact structure 54, and gate cap 40.

In the specific embodiment illustrated in the drawings, a portion of cut semiconductor fin F3X remains tucked under the functional gate structure 38 that is present in the PFET device region. Thus, the functional gate structure 38 contacts a topmost surface and one of the sidewall surfaces of the cut semiconductor fin 3FX; the other sidewall surface of the cut semiconductor fin F3X contacts an outermost sidewall of the dielectric liner 30L that is present on the first sidewall, S1, of dielectric plug 32. As stated above, the tucked portion of F3X serves as a dummy channel in the final structure. In other embodiments, in which other semiconductor channel-containing structures are used, a portion of the cut semiconductor channel-containing structure will remain tucked beneath a functional gate structure.

The terminology used herein is for the purpose of describing particular embodiments only and is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
    a dielectric plug located in a gate cut region and having a first sidewall, a bottom wall, and a second sidewall opposite the first sidewall;
    a dielectric liner located in the gate cut region and on an entirety of the second sidewall of the dielectric plug, the bottom wall of the dielectric plug, and a lower portion of the first sidewall of the dielectric plug; and
    a cross-couple contact structure located on, and physically contacting, a topmost surface of a functional gate structure that is located laterally adjacent to the gate cut region, wherein the cross-couple contact structure extends into the gate cut region and physically contacts a sidewall of the functional gate structure, an upper portion of the first sidewall of the dielectric plug, and an upper surface of the dielectric liner that is located on the lower portion of the first sidewall of the dielectric plug.

2. The semiconductor structure of claim 1, wherein a first vertical extending portion of the dielectric liner is located entirely on the second sidewall of the dielectric plug, and a second vertical extending portion of the dielectric liner is located on the lower portion of the first sidewall of the dielectric plug, wherein the first vertical extending portion has a height that is greater than the second vertical extending portion.

3. The semiconductor structure of claim 2, wherein the first vertical extending portion of the dielectric liner has a topmost surface that is coplanar with a topmost surface of each of the dielectric plug and the cross-couple contact structure.

4. The semiconductor structure of claim 1, wherein the dielectric liner is composed of a first dielectric material and the dielectric plug is composed of a second dielectric material that is compositionally different from the first dielectric material.

5. The semiconductor structure of claim 4, wherein the first dielectric material is a silicon nitride based dielectric material, and the second dielectric material is a silicon carbon based dielectric material.

6. The semiconductor structure of claim 1, wherein the first sidewall of the dielectric plug faces a cut semiconductor channel-containing structure, and the second sidewall of the dielectric plug faces a non-cut semiconductor channel-containing structure.

7. The semiconductor structure of claim 6, wherein the cut semiconductor channel-containing structure is located in a PFET device region, and the non-cut semiconductor channel-containing structure is located in an NFET device region.

8. The semiconductor structure of claim 6, wherein a portion of the cut semiconductor channel-containing structure is tucked beneath the functional gate structure.

9. The semiconductor structure of claim 6, wherein the cut semiconductor channel-containing structure is a cut semiconductor fin, and the non-cut semiconductor channel-containing structure is a non-cut semiconductor fin.

10. The semiconductor structure of claim 1, wherein the first sidewall of the dielectric plug faces a first non-semiconductor channel-containing structure that has a portion tucked under the functional gate structure and present in a PFET device region, and the second sidewall of the dielectric plug faces a non-cut semiconductor channel-containing structure that is present in an NFET device region.

11. The semiconductor structure of claim 1, wherein the first and second sidewalls of the dielectric plug are tapered sidewalls that increase upward from a bottommost surface of the dielectric plug to a topmost surface of the dielectric plug.

12. The semiconductor structure of claim 1, wherein the functional gate structure contacts a topmost surface and one sidewall surface of a cut semiconductor channel-containing structure, and the other sidewall surface of the cut semiconductor channel-containing structure contacts an outermost sidewall of the dielectric liner.

13. The semiconductor structure of claim 1, wherein the gate cut region is located over a shallow trench isolation structure that is located on a substrate.

14. A method of forming a semiconductor structure, the method comprising:
    forming a gate cut region between two laterally adjacent semiconductor channel-containing structures, wherein one of the semiconductor channel-containing structures is a present in an NFET device region and the other of the semiconductor channel-containing structures is located in a PFET device region;
    forming a bilayer dielectric material structure in the gate cut region, wherein the bilayer dielectric material structure comprises a dielectric plug having a first sidewall, a bottom wall, and a second sidewall opposite the first sidewall, and a dielectric layer lining the first sidewall, the bottom wall, and the second sidewall of the dielectric plug, and wherein the first sidewall of the dielectric plug faces the semiconductor channel-containing structure present in the PFET device region;
    forming a functional gate structure on the semiconductor channel-containing structure in at least the PFET device region;
    forming a cross-couple contact region that physically exposes a topmost surface of the functional gate structure present in the PFET device region, wherein during the forming of the cross-couple contact region an upper portion of the dielectric layer that is located the first sidewall of the dielectric plug is removed; and
    forming a cross-couple contact structure in the cross-couple contact region, wherein the cross-couple contact structure physically contacts a topmost surface of the functional gate structure present in the PFET device region, and extends into the gate cut region so that the cross-couple contact structure physically contacts a sidewall of the functional gate structure, an upper portion of the first sidewall of the dielectric plug, and an upper surface of the dielectric layer that is located on a lower portion of the first sidewall of the dielectric plug.

15. The method of claim 14, wherein the semiconductor channel-containing structure in the PFET device region is a cut semiconductor channel-containing structure.

16. The method of claim 15, wherein a portion of the cut semiconductor channel-containing structure is tucked beneath the functional gate structure in the PFET device region.

17. The method of claim 15, wherein the cut semiconductor channel-containing structure is a cut semiconductor fin.

18. The method of claim 14, wherein the dielectric layer is composed of a first dielectric material and the dielectric plug is composed of a second dielectric material that is compositionally different from the first dielectric material.

19. The method of claim 18, wherein first dielectric material is a silicon nitride based dielectric material, and the second dielectric material is a silicon carbon based dielectric material.

20. The method of claim 18, wherein the forming the cross-couple contact region comprises an etching process that removes the first dielectric material selective to the second dielectric material.

\* \* \* \* \*